United States Patent
Ogino et al.

[11] Patent Number: 5,651,494
[45] Date of Patent: Jul. 29, 1997

[54] METHOD OF ULTRASONIC WELDING OF DIFFERENT METALS

[75] Inventors: Akihiko Ogino, Chita; Tamaki Suzuki, Obu, both of Japan

[73] Assignee: Nippondenso Co., Ltd., Kariya, Japan

[21] Appl. No.: 616,641

[22] Filed: Mar. 15, 1996

[30] Foreign Application Priority Data

Mar. 17, 1995 [JP] Japan .................. 7-059359

[51] Int. Cl.⁶ .......................... B23K 20/10; H01L 21/607
[52] U.S. Cl. ........................ 228/110.1; 228/233.1
[58] Field of Search ................ 228/106, 110.1, 228/111, 233.1, 262.44, 1.1, 5.5

[56] References Cited

U.S. PATENT DOCUMENTS

| | | | |
|---|---|---|---|
| 3,360,849 | 1/1968 | Forman et al. | 228/110.1 |
| 3,650,454 | 3/1972 | Coucoulas | 228/5.5 |
| 3,670,394 | 6/1972 | Daniels et al. | 228/110.1 |
| 4,757,933 | 7/1988 | Hawkins et al. | 228/110.1 |
| 5,288,006 | 2/1994 | Otsuka et al. | 228/111 |
| 5,511,719 | 4/1996 | Miyake et al. | 228/106 |

FOREIGN PATENT DOCUMENTS

| | | |
|---|---|---|
| 60-3189 | 1/1985 | Japan . |
| 60-206054 | 10/1985 | Japan . |
| 61-37335 | 2/1986 | Japan . |
| 62-167040 | 7/1987 | Japan . |

*Primary Examiner*—Samuel M. Heinrich
*Attorney, Agent, or Firm*—Cushman, Darby & Cushman IP Group of Pillsbury Madison & Sutro LLP

[57] ABSTRACT

A stack of two different metals to be welded, one of which is harder than the other, and an additional soft metal placed on the harder metal is placed between a pair of horn tips (grip members) of an ultrasonic welder. The harder metal is covered with a soft metal layer of a high plastic fluidity. Serrations are formed on the surface of the horn tips to grip the softer metal and the additional metal tightly during ultrasonic vibration is applied.

10 Claims, 4 Drawing Sheets

FIG. 4
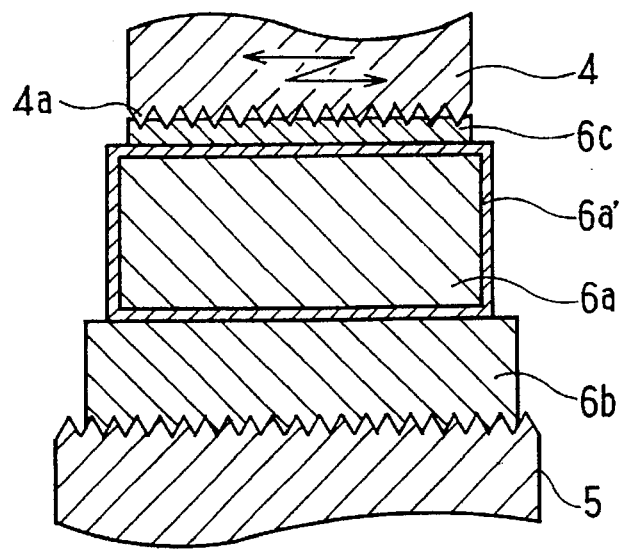
FIG. 5A
FIG. 5B
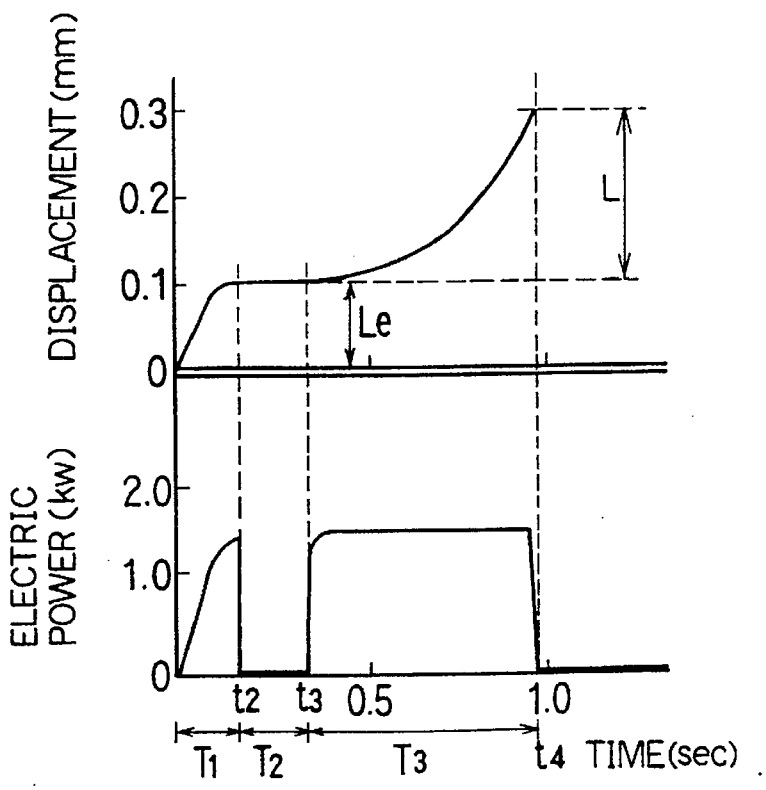

5,651,494

METHOD OF ULTRASONIC WELDING OF DIFFERENT METALS

CROSS REFERENCE TO RELATED APPLICATION

The present application is based on and claims priority from Japanese Patent Application No. Hei 7-59359 filed on Mar. 17, 1995, the contents of which are incorporated herein by reference.

BACKGROUND OF THE INVENTION

1. Field of the Invention

The present invention relates to a method of ultrasonic welding of different metals having different hardness such as steel and aluminum.

2. Description of the Related Art

The ultrasonic welding of different metals has been used because it is available at normal or low temperature.

However, when an extremely hard metal is welded to a soft metal by the ultrasonic welding, the bonding strength is not always ensured because the ultrasonic vibration cannot be transmitted to the soft metal.

SUMMARY OF THE INVENTION

The present invention is made in view of the foregoing problems, and has a primary object of providing an improved method of ultrasonic welding of metals having different hardness.

Another object of the present invention is to provide a method of ultrasonic welding of different metals which comprises steps of providing an additional metal plate which is thick enough to carry a horn tip of an ultrasonic welder without penetration, sandwiching a harder one of the metals to be welded between a softer one of the metals to be welded and the additional metal plate to form a stack of different metals and applying ultrasonic vibration to the stack under a fixed pressure. Thus, the ultrasonic vibration can be transmitted to the diffent metals to be welded surely.

Another object of the present invention is to provide a method of ultrasonic welding of different metals, which, in addition to the steps as stated above, further comprises a step of detecting displacement of the horn tips a fixed period after ultrasonic vibration is applied so that the ultrasonic vibration is terminated when the displacement becomes a predetermined value. Since the displacement is detected after a fixed period, it directly relates to bonding of the metal pieces so that reliable control of the bonding condition is ensured.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

FIG. 4 is a cross-sectional view illustrating the metal pieces to be welded in the grip of the weld tips according to the first embodiment;

FIG. 5A is a graph showing relationship between time and displacement of the metal pieces to be welded according to a second embodiment of the present invention and FIG. 5B is a graph showing relationship between time and power applied to the metal pieces to be welded according to the second embodiment.

DETAILED DESCRIPTION OF THE PREFERRED EMBODIMENT

Preferred embodiment according to the present invention will now be described with reference to the appended drawings.

A method of ultrasonic welding according to a first embodiment of the present invention is described with reference to FIG. 1 through FIG. 4.

Figure 1:
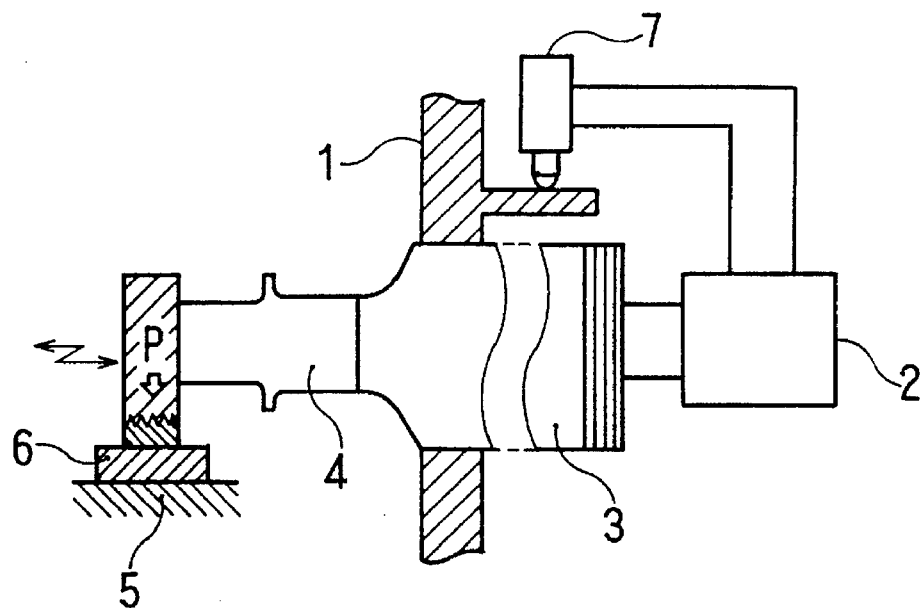
FIG. 1 is a schematic view illustrating a method of ultrasonic welding according to a first embodiment of the present invention.
Figure 2:
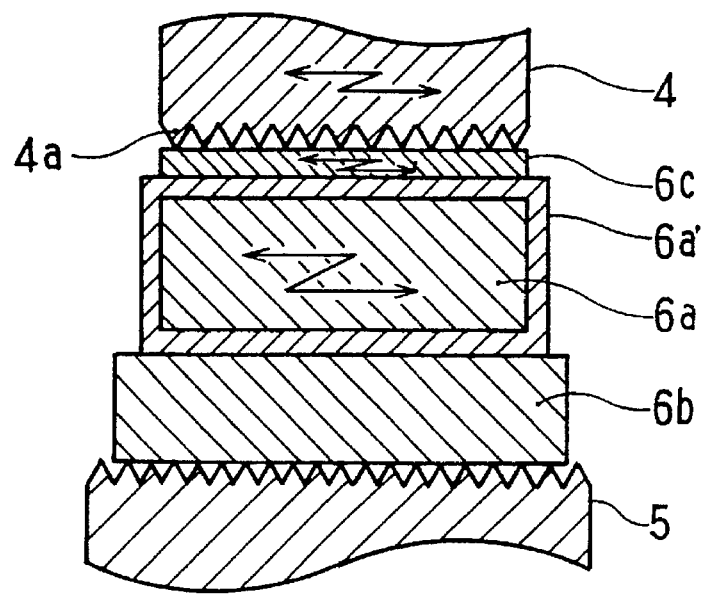
FIG. 2 is a cross-sectional view illustrating metal pieces to be welded between weld tips according to the first embodiment.

In FIG. 1, a holder 1 holds an ultrasonic vibrator 3 which has a weld tip or horn tip 4 at an end thereof. A work bench 5 holds a material 6 composed of two metal members to be welded. The vibrator 3 presses the horn tip 4 on the material 6 at a fixed pressure and is controlled by a controller 2 to vibrate the horn tip 4 laterally. A displacement sensor 7 is installed on the holder to detect displacement of the vibrator 3 in process of welding. The displacement sensor 7 is composed of a linear gage, for example, and connected to the controller 2 to send it a displacement signal.

The material 6 is composed of a hard metal piece 6a such as carbon steel piece covered with a soft metal layer 6a' of high plastic fluidity such as copper layer, a soft metal piece such as aluminum piece disposed between the hard metal piece 6a and the workbench 5 and a another soft metal piece such as capper piece disposed between the hard metal piece 6a and the horn tip 4. The soft metal layer 6a' is 5–10 μm thick, and the other soft metal piece 6c is thicker than the height of serrations 4a formed on a surface of the horn tip 4. The hardness of the other metal 6c is almost as same as that of pure copper (Vickers hardness of 50–110).

Figure 3A:
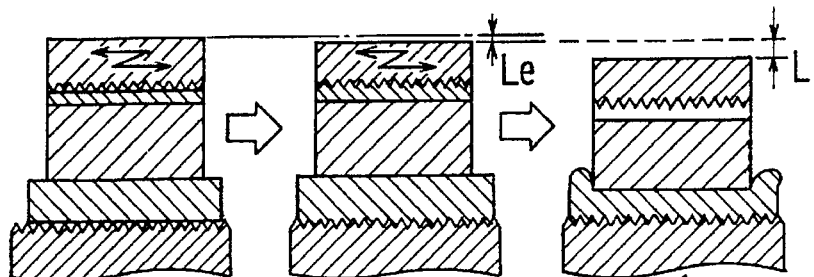
FIGS. 3A is a diagrammatical view illustrating sequence of welding process according to the second embodiment.
Figure 3B:
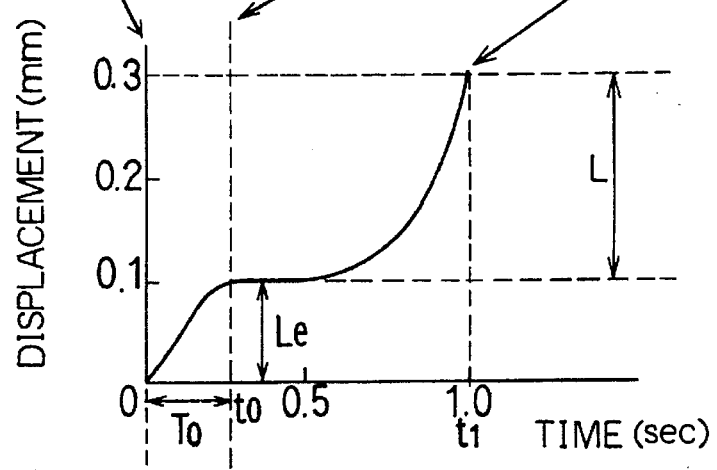
FIG. 3B is a graph showing relationship between time and displacement of the metal pieces to be welded in the above process and FIG. 3C is a graph showing relationship between time and power applied to the metal pieces to be welded in the above process.
Figure 3C:
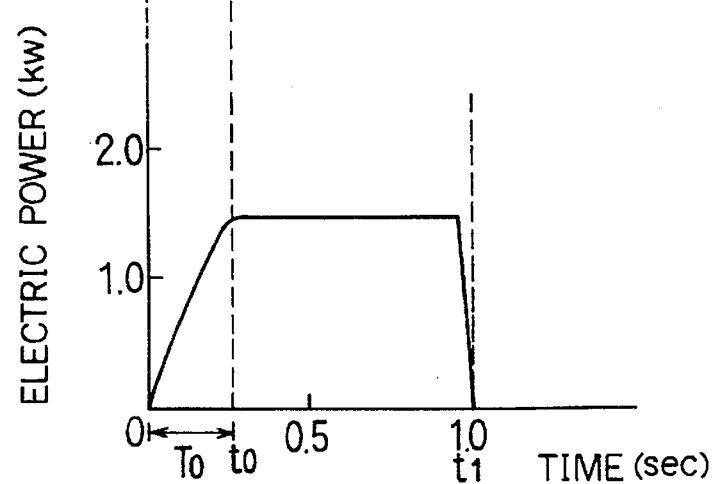

A welding process according to the first embodiment is described with reference to FIG. 3 next.

At the beginning, the soft metal piece 6b is put on the workbench 5, and the hard metal piece 6a and the other soft metal piece 6c are piled up in this order. Then, the horn tip 4 is pressed on a surface of the other soft metal piece 6c at a fixed pressure P, and the ultrasonic vibrator 3 is switched on. As the input power of the vibrator 3 increases as indicated by a solid line in a period $T_0$ shown in FIG. 3C, the vibrator 3 starts lateral vibration thereby to vibrate the horn tip 4 laterally. As a result, the serrations 4a of the horn tip 4 are dug into the other soft metal piece 6c gradually to grip it tightly as shown in FIG. 4 and vibrate it together with the horn tip 4. The depth of the serrations 4a dug into the other metal 6C is preferably between a half of the thickness of the other metal piece 6C and the height of the serrations 4a.

Since the other soft metal piece 6c is thicker than the height of the serrations 4a, an edge of the serrations may not come into contact with the hard metal piece 6a.

While the other metal piece 6c is being vibrated by the horn tip 4, it is bonded with the soft metal layer 6a', and, further, the soft metal layer 6a' is bonded with the soft metal piece 6b. Thus, thickness of the material 6 gradually decreases as shown in FIG. 3A. The soft metal layer 6a' can be omitted if the ultrasonic vibration is controlled properly.

The displacement sensor 7 detects the displacement of the material 6, that is decrease in the thickness of the material 6, a period $T_0$ (0.2–0.3 sec) after the vibrator 3 is switched on. The serrations are almost dug into the other soft material in this period $T_0$.

When the displacement becomes a fixed value L at time t1, the controller 2 cuts the electric power supplied to the vibrator 3, thereby to stop the lateral vibration of the horn tips 4a. Since the displacement L detected after the period $T_0$ directly relates to bonding of the metal pieces, reliable control of the bonding condition is ensured.

A method of the ultrasonic welding according to a second embodiment of the present invention is described with reference to FIG. 5A and FIG. 5B.

Electric power supplied to the vibrator 3 is cut at time t2 a first period T1 after a switch is turned on, and the switch is turned on again at a time t3 a second period T2 after the time t2 as shown in FIG. 5B. Then, the displacement in the thickness of the material 6 is detected in a third period T3 until the displacement becomes L and the switch is turned off at time t4. The first period T2 is set for a period to dig the serration 4a of the horn tip into the other soft metal 6c and to eliminate other factors which do not relate to the bonding. The second period is set for a period to cool the material heated by the vibration to a normal temperature, and the third period T3 is set for a period to weld the material 6.

Figure 6:
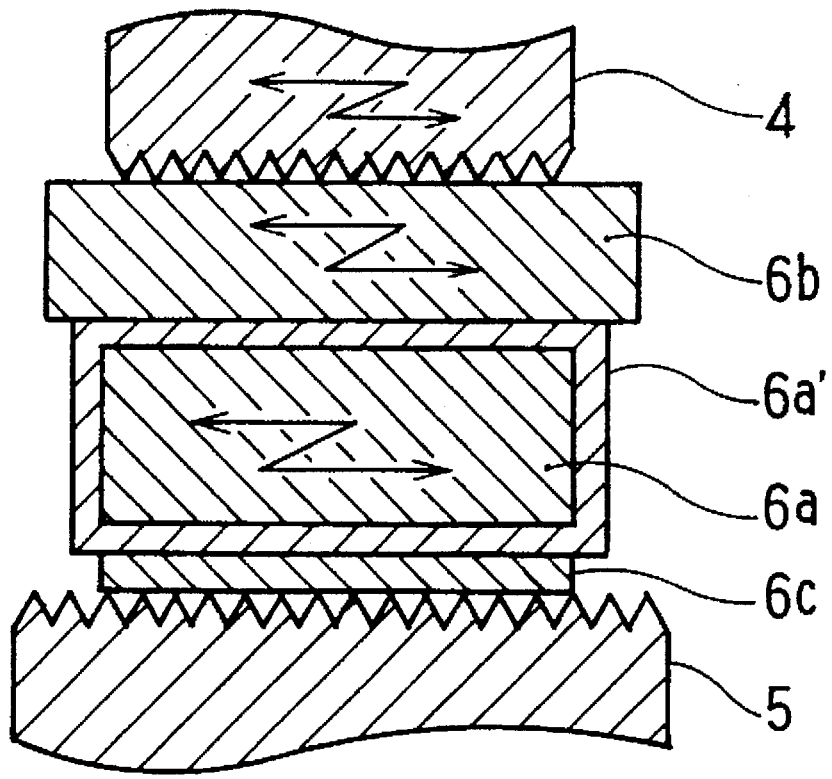
FIG. 6 is a cross-sectional view illustrating metal pieces to be welded between weld tips according to the second embodiment.

As a variation of the material 6 described above, the soft metal pieces 6b and 6c can be replaced with each other as shown in FIG. 6. The material 6 is welded in the same way as the above described embodiments.

In the foregoing discussion of the present invention, the invention has been described with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than a restrictive, sense.

What is claimed is:

1. A method of ultrasonic welding of different metals one of which is harder than the other, said method comprising steps of:

providing an ultrasonic welder including a vibrator and a pair of horn tips driven by said vibrator;

providing an additional metal plate which is thick enough to receive said horn tips under a welding pressure and as soft as copper;

sandwiching said harder metal between said softer metal and said additional metal to form a stack of different metals; and applying ultrasonic vibration to said stack under said welding pressure.

2. A method of ultrasonic welding of different metals one of which is harder than the other, said method comprising steps of:

providing an ultrasonic welder including a vibrator and a pair of horn tips driven by said vibrator;

plating said harder metal with a soft metal;

sandwiching said harder metal between said softer metal and an additional soft metal plate which is as soft as pure copper to form a stack of different metals;

placing said stack between said horn tips; and applying ultrasonic vibration to said horn tips under a fixed pressure.

3. A method of ultrasonic welding of different metals as claimed in claim 1 further comprising a step of detecting displacement of said horn tips a fixed period after ultrasonic vibration is applied; wherein said ultrasonic vibration applying step is terminated when said displacement becomes a predetermined value.

4. A method of ultrasonic welding of different metals as claimed in claim 1 further comprising a step of detecting displacement of said horn tips; wherein said ultrasonic vibration applying step is interrupted after a first fixed period and is resumed a second period after said first period;

said detecting step is started after said second period; and said ultrasonic vibration applying step is terminated when said displacement becomes a predetermined value.

5. A method of ultrasonic welding of different metals one of which is harder than the other, said method comprising steps of:

providing an ultrasonic welder including a vibrator and a pair of grip members which is harder than said softer metal and is driven by said vibrator;

providing an additional metal plate which is thick enough to receive said grip member without penetration and is as soft as copper;

placing said harder metal and softer metal between said grip members to form a stack of different metals;

inserting said additional metal between said harder metal and one of said grip members;

digging a portion of said grip members into said additional metal and said softer metal; and applying said grip members ultrasonic vibration to said grip members under a fixed pressure.

6. A method of ultrasonic welding of different metals as claimed in claim 5, wherein said portion of said grip members comprise serrations.

7. A method of ultrasonic welding of different metals as claimed in claim 6, wherein said additional metal plate has thickness thicker than height of said serrations of said grip members.

8. A method of ultrasonic welding of different metals as claimed in claim 5 further comprising a step of detecting displacement of said grip members a fixed period after ultrasonic vibration is applied; wherein said ultrasonic vibration applying step is terminated when said displacement becomes a predetermined value.

9. A method of ultrasonic welding of different metals as claimed in claim 5 further comprising a step of detecting displacement of said grip member; wherein said ultrasonic vibration applying step is interrupted after a first fixed period and is resumed a second period after said first period;

said detecting step is started after said second period; and said ultrasonic vibration applying step is terminated when said displacement becomes a predetermined value.

10. A method of ultrasonic welding of different metals as claimed in claim 5 further comprising:

a step of plating said harder metal with a metal which is as soft as copper.

* * * * *